United States Patent [19]

Ramachandran

[11] Patent Number: 5,889,685
[45] Date of Patent: Mar. 30, 1999

[54] METHOD AND APPARATUS FOR AUTOMATICALLY CHARACTERIZING SHORT CIRCUIT CURRENT AND POWER CONSUMPTION IN A DIGITAL CIRCUIT

[75] Inventor: Arun Ramachandran, Fremont, Calif.

[73] Assignee: Cirrus Logic, Inc., Fremont, Calif.

[21] Appl. No.: 691,337

[22] Filed: Aug. 2, 1996

[51] Int. Cl.$^6$ .................................................. G06F 17/50
[52] U.S. Cl. .................... 364/578; 364/489; 364/490; 395/500
[58] Field of Search ...................... 364/578, 489

[56] References Cited

U.S. PATENT DOCUMENTS

| | | | |
|---|---|---|---|
| 4,651,088 | 3/1987 | Sawada | 324/73 |
| 4,763,289 | 8/1988 | Barzilai et al. | 364/578 |
| 4,766,595 | 8/1988 | Gollomp | 371/23 |
| 4,787,061 | 11/1988 | Nei et al. | 364/900 |
| 5,067,130 | 11/1991 | Jackson | 371/22.1 |
| 5,206,582 | 4/1993 | Ekstedt et al. | 324/73.1 |
| 5,297,066 | 3/1994 | Mayes | 364/578 |
| 5,304,925 | 4/1994 | Ebina | 324/158 |
| 5,406,217 | 4/1995 | Habu | 324/765 |
| 5,440,568 | 8/1995 | Foster | 395/500 |
| 5,497,095 | 3/1996 | Ueyama et al. | 324/537 |
| 5,508,632 | 4/1996 | Shimizu et al. | 324/769 |
| 5,612,636 | 3/1997 | Ko | 326/83 |
| 5,625,803 | 4/1997 | McNelly et al. | 395/500 |
| 5,682,320 | 10/1997 | Khouja et al. | 364/489 |
| 5,696,694 | 12/1997 | Khouja et al. | 364/488 |

OTHER PUBLICATIONS

Verilog LRM Reference Manual Chapters 1, 6, 7 and 12, Version 1.0.

*Primary Examiner*—Kevin J. Teska
*Assistant Examiner*—Mark J. Fink
*Attorney, Agent, or Firm*—Robert P. Bell; Steven A. Shaw

[57] ABSTRACT

Short-circuit current and power consumption for an integrated circuit may be calculated by measuring short-circuit current for various cells within an integrated circuit using a Verilog™ logic level model of the cell. Each cell within an integrated circuit may be characterized by its inputs and outputs and connectivity. A corresponding SPICE sub-circuit model having the same logic characteristics as the cell may be generated. A number of calculation passes are made for each sub-circuit within a cell to determine short circuit current for each sub-circuit at various signal rise and fall times and for various inputs and outputs. Current data may be stored in a format compatible with Verilog™ propagation delay data. Overall power consumption and short circuit current for an integrated circuit may then be calculated from Verilog™ logic model data. The use of the Verilog™ model eliminates the need to calculate short circuit current at a SPICE circuit level. Moreover, putting short circuit data into a propagation delay format allows software to more readily process short circuit data.

11 Claims, 7 Drawing Sheets

```
primitive inv_z (z, i);
output z;
input   i;
table
0 : 1;
1 : 0;
endtable
endprimitive 'celldefine
module inv (i, z);
input 1;
output z;
specify
  (i => z) = (1.0, 1.0);
endspecify
inv_z (z, i);
endmodule 'endcelldefine
```

Figure 7

METHOD AND APPARATUS FOR AUTOMATICALLY CHARACTERIZING SHORT CIRCUIT CURRENT AND POWER CONSUMPTION IN A DIGITAL CIRCUIT

FIELD OF THE INVENTION

The present invention relates generally to systems and methods for designing and proving integrated circuit designs, particularly for systems and methods for determining short circuit current and measuring power consumption in an integrated circuit design.

BACKGROUND OF THE INVENTION

Modern integrated circuits may be designed by combining a number of individual blocks or "cells". The functionality and design of individual cells may be predetermined and stored on a computer system as a standardized design. Such design techniques may save considerable time, as it no longer may be necessary for an integrated circuit designer to custom design each individual gate and transistor in an integrated circuit. Rather, the circuit designer may break down a new circuit design into a number of known (or new) cell designs and then combine these cells appropriately to generate a circuit design which will perform a desired function.

Once a circuit has initially been designed, it may be modeled using one or more circuit emulation programs, such as SPICE, VERILOG™ or VHDL. SPICE (Simulation Program with Emphasis on Circuit Emulation) is an integrated circuit emulation program developed at the University of Southern California at Berkeley which emulates performance of individual circuit elements (e.g., transistors) and may be used to emulate performance of one or more transistors in a circuit. SPICE programs are commercially available from a number of vendors. One example of a SPICE program is the HSPICE™ program from Meta-Software™, Inc., of Campbell, Calif.

VERILOG™ or VHDL are hardware description languages which may be used to describe, at a logic level, an integrated circuit design. Verilog-XL™, produced by Cadence Design Systems, Inc., of San Jose, Calif. is a software program which may emulate the performance of a circuit described using the VERILOG™ hardware description language. The VERILOG™ hardware description language is now part of IEEE standard P1364 incorporated herein by reference. The Verilog-XL™ program may perform a number of functions. One function, for example, may be to calculate propagation delays generated by successive gates. The Verilog-XL™ program may calculate such propagation delays and use such information to calculate overall propagation delays for a particular cell or group of cells.

When designing and proving an integrated circuit, it may be desirable to calculate overall power consumption and maximum power consumption for the overall circuit, as well as power consumption for individual cells. Each new design for an integrated circuit may incorporate new cell types or designs. Thus, in the prior art, in order to calculate overall short circuit current, considerable effort must be made to generate a SPICE model for each cell design, and generate suitable short circuit current models for each cell. Such modeling efforts may be time consuming and cumbersome and may increase new product development cycle times.

Short circuit current for a particular circuit element may be defined as the maximum current generated from supply voltage $V_{DD}$ to ground $V_{SS}$. FIG. 1 illustrates an example of a well-known CMOS circuit for an inverter gate. Referring to FIGS. 1 and 2, short circuit current will be discussed.

In the embodiment of FIG. 2, a digital input signal may be input to input line 230. If the input signal on input line 230 is high, p-channel MOS transistor 240 may turn off, n-channel MOS transistor 241 may turn on, and output line 290 may go low. If the input signal on input line 230 is low, p-channel MOS transistor 240 may turn on, n-channel MOS transistor 241 may turn off, and output line 290 may go high.

The above description of FIG. 2, however, assumes ideal conditions, namely an instantaneous transfer of the input signal from a high level to a low level and vice versa. Due to propagation delays, transition from a high level voltage to a low level voltage (and vice versa) may not be instantaneous, but rather may ramp up or down over a given period of time.

FIG. 1 illustrates the three states of the inverter gate of FIG. 2 when transitioning from a low input voltage to a high input voltage. In step 110, the input voltage in input line 230 may be low, and p-channel MOS transistor 240 may be on, and n-channel MOS transistor 241 may be off. In step 120, the input voltage on input line 230 may transition from a low to high state. For a brief given instant, both p-channel MOS transistor 240 and n-channel MOS transistor 241 may both be on. In step 130, the input voltage on input line 230 may go high, and p-channel MOS transistor 240 may turn off and n-channel MOS transistor 241 may remain on.

During step 120, a short circuit may occur in the inverter circuit, as illustrated in FIG. 3. With both p-channel MOS transistor 240 and n-channel MOS transistor 241 in the on state, current may pass from supply voltage $V_{DD}$ line 220 through p-channel MOS transistor 240 and n-channel MOS transistor 241 to ground voltage $V_{SS}$ line 270. The inverter circuit of FIGS. 2 and 3 is a fundamental element in CMOS gate design, and thus, such short circuit currents may occur in other gate designs as well. The use of an inverter circuit is illustrated here by way of example only.

Depending upon the extent of propagation delays and the slope of the transition of input signals, the short circuit current of individual gates may consume considerable amounts of power. In general, the more gradual the transition from high to low level (or vice versa) the more power may be consumed by a gate, as the gate may remain in a short circuit condition for a longer period of time.

A circuit designer may wish to detect portions of an integrated circuit design with a voracious appetite for power. Once such circuit portions have been identified, step may be taken to reduce power consumption. For example, some circuit portions may be connected to further logic gates to switch such portions off when not in use. Alternatively, or in addition, the input signals to such circuit portions may be "squared up" using a buffer or the like to reduce the amount of time a circuit is in a short circuit condition.

However, as discussed above, it may be onerous to model each cell within an integrated circuit design for short circuit conditions using a SPICE type program.

SUMMARY OF THE INVENTION

To overcome the limitations of the prior art, in the present invention, short-circuit current and power consumption for an integrated circuit may be calculated by measuring short-circuit current for various cells within an integrated circuit using a VERILOG™ hardware description of the cell. Each cell within an integrated circuit may be broken up into sub-circuits, and each sub-circuit characterized by its inputs and outputs and connectivity. A number of calculation passes are made for each sub-circuit within a cell to determine short circuit current for each sub-circuit for various signal rise and fall times. Current data may be stored in a format compatible with VERILOG™ propagation delay data. Overall power consumption and short circuit current for an integrated circuit may then be calculated from VERILOG™ logic model data. The use of the VERILOG™ model eliminates the need to calculate short circuit current at a SPICE circuit level. Moreover, putting short circuit data into a propagation delay format allows for power consumption to be more readily calculated.

BRIEF DESCRIPTIONS OF THE DRAWINGS

FIG. 4 illustrates how short circuit current may be modeled using a SPICE program or the like.

FIG. 7 illustrates a code segment for creating a truth table for a cell by simulating the cell through all possible input combinations.

DETAILED DESCRIPTION OF THE INVENTION

Figure 1:
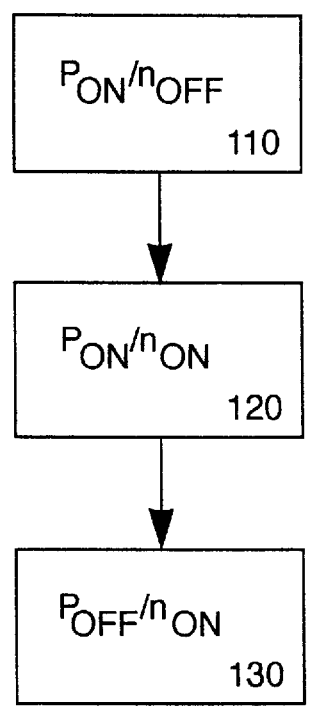
FIG. 1 is a block diagram illustrating three states of the simple inverter circuit of FIG. 2.

The descriptions herein are used as examples only illustrative of the preferred embodiment of the present invention. However, it should be noted that the methods and systems of the present invention may be applied in a similar manner in other embodiments without departing from the spirit of the invention.

In the present invention, an integrated circuit design may be made up of a number of standardized or custom cells, each of which may be defined by a particular functionality or truth table. Rather than model the actual circuitry for each cell using a SPICE program, the system and method of the present invention determines overall short circuit current based upon the functionality of the cell. The actual construction of each cell is irrelevant and not required for the system and method of the present invention.

In the first part of the system and method of the present invention, a model of the cell under study is made according to Chapter 12 of the IEEE VERILOG™ reference manual, incorporated herein by reference. The semantics for describing such models are also described in Chapter 1 of the IEEE VERILOG™ reference manual, also incorporated herein by reference.

A VERILOG™ model of a cell is a methodology for modeling cells by defining the cell as a number of inputs and outputs and defining the logical relationship between input and output. The VERILOG™ model also contains information about the timing behavior of the model. VERILOG™ also contains routines for generating SPICE type circuit models (Chapters 14 and 15 if the IEEE VERILOG™ manual), however, such features may not be utilized in the preferred embodiment of the present invention.

Once a VERILOG™ functional description of a cell has been generated as a "black box" model, the model may be divided into a number of known "sub-circuits". Each sub-circuit may be modeled using SPICE circuit models.

VERILOG™ user defined primitives (UDP) are basically a truth table description of the functionality of a circuit. Data in a UDP may take one of four values, 0, 1, X (undefined) and Z (tri-state). Because they have four values, UDPs tend to be larger in size that typical truth tables which may have only 0 and 1 values; In the present invention, a UDP model of a cell may be reduced to a truth table format by throwing out the X (undefined) and Z (tri-state) values.

UDP models for each cell may have previously been created when designing a circuit or when testing for propagation delays. Thus, little or no extra labor is required to produce the reduced UDP for the present invention.

Short circuit current may be measured for each sub-circuit using a SPICE program. A netlist, or interconnect description, may be provided to describe the interconnection of a sub-circuit for a SPICE program. Examples of sub-circuits include inverter gates, AND gates, OR gates, NOR gates, XOR gates, a combined AND/OR gate, or an AOI (AND/OR/Inverter) gate.

From the reduced UDP model of a cell, a hypothetical logic arrangement for that cell may be implied. Actual connectivity of logic gates may not be necessary in order to calculate short circuit current with a certain degree of accuracy. From the reduced UDP model, a sub-circuit model may be generated comprising a logical arrangement of known inverter gates such as those listed above. A SPICE model for such sub-circuits may be well known, and thus calculating short circuit current for such known sub-circuit designs may be achieved without difficulty.

Figure 2:
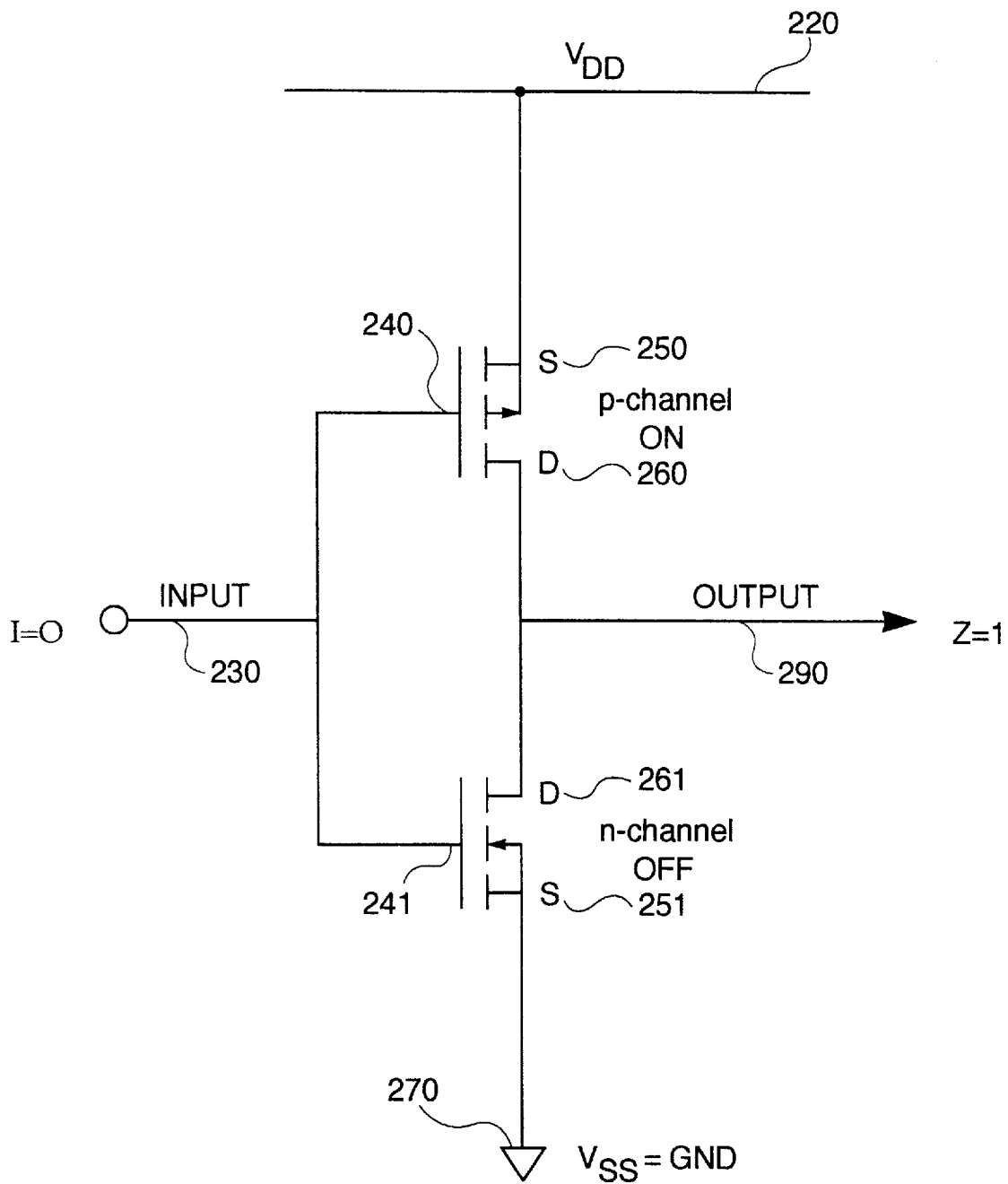
FIG. 2 is a circuit diagram of a simple inverter circuit of the prior art.
Figure 3:
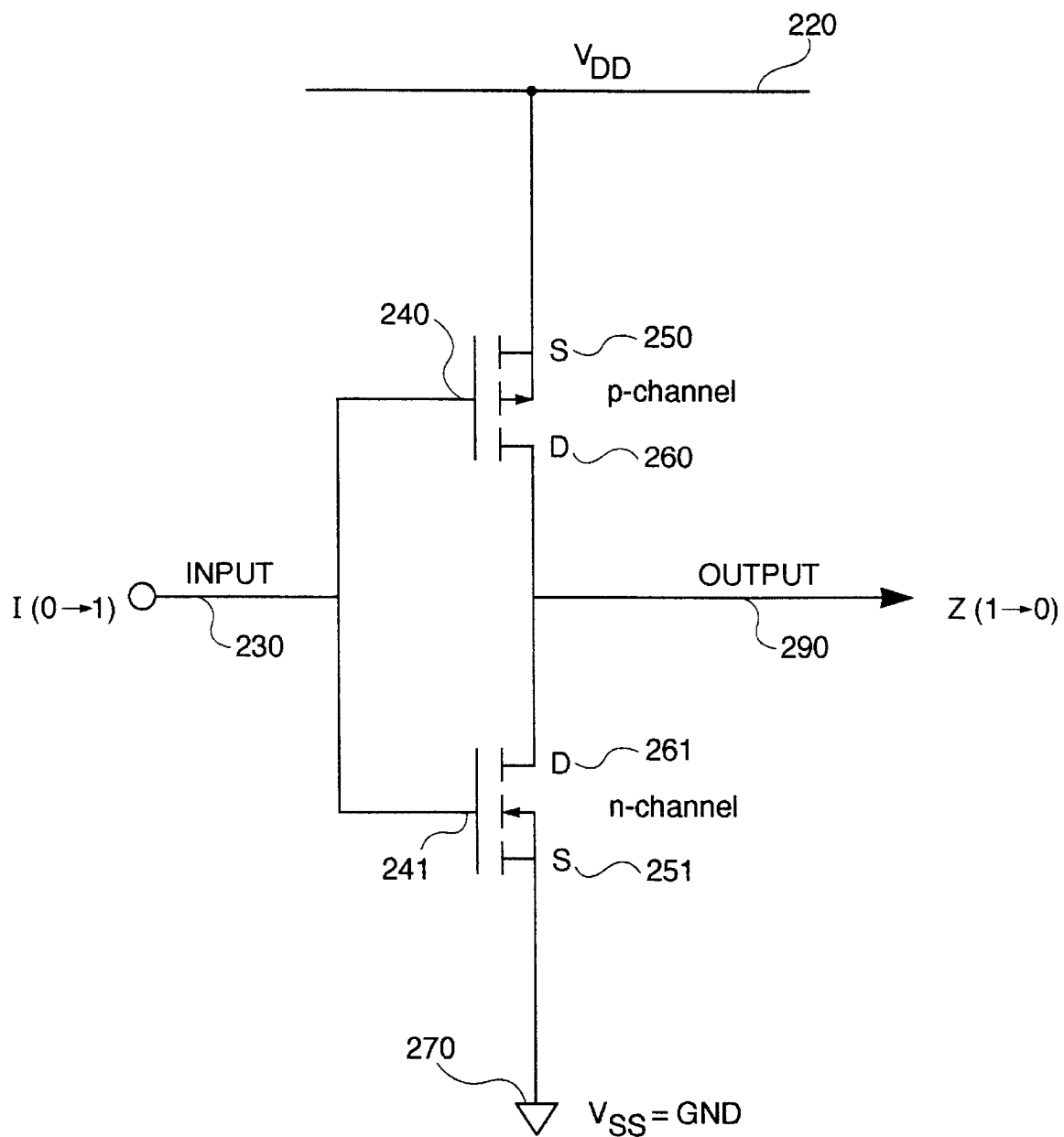
FIG. 3 illustrates short circuit current for the inverter circuit of FIG. 2.
Figure 4:
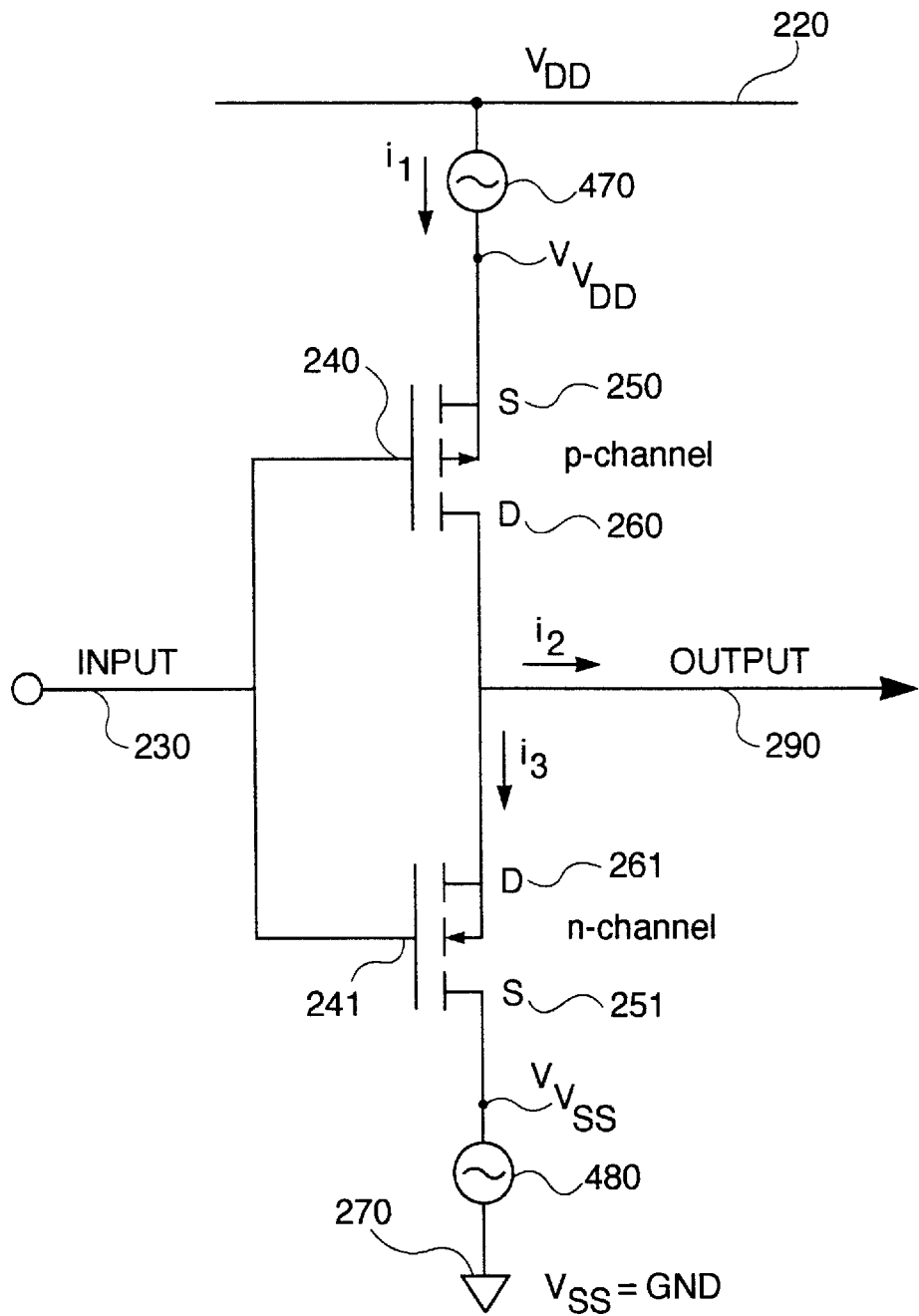

FIG. 4 illustrates a technique for modeling the inverter circuit of FIG. 2 in a SPICE program. Current meters 470 and 480 may be inserted into the circuit model and the resulting current measured for various input to output transitions. Current meters 470 and 480 are not physical current meters, but rather represent virtual current measurement in a SPICE software program.

The SPICE software program may then measure the maximum amount of current generated. Current may pass from supply voltage $V_{DD}$ through p-channel MOS transistor 240 as represented as current $i_1$. As output 290 may drain some current $i_2$ from the inverter, the maximum current will probably be seen by current meter 470. Current will also pass through n-channel MOS transistor 240 as current $i_3$, where $i_3=i_1-i_2$.

Thus, in the present invention, a model of an integrated circuit may be broken down into cells which may be defined by a reduced truth table. The reduced truth table may then be converted into a model of standard sub-circuits. Short circuit current for standard sub-circuits may be readily measured using SPICE techniques.

To measure short circuit current, the minimum value measured by current meters 470 and 480 is taken. In this instance, short circuit current, the amount passing from supply $V_{DD}$ to ground $V_{SS}$ is equal to $i_3$, or the current measured by current meter 480.

In addition, the apparatus and method of the present invention allows for short circuit current for an overall circuit to be readily modeled and analyzed without the need for customized software or arduous hand calculations. In particular, in the present invention, short circuit current may be stored in a Standard Delay Format (SDF), typically used by VERILOG™ modeling to measure propagation delays within a chip. VERILOG™ software, with little or no modification, may store and analyze short circuit current merely by placing short circuit current data into SDF fields.

Figure 5:
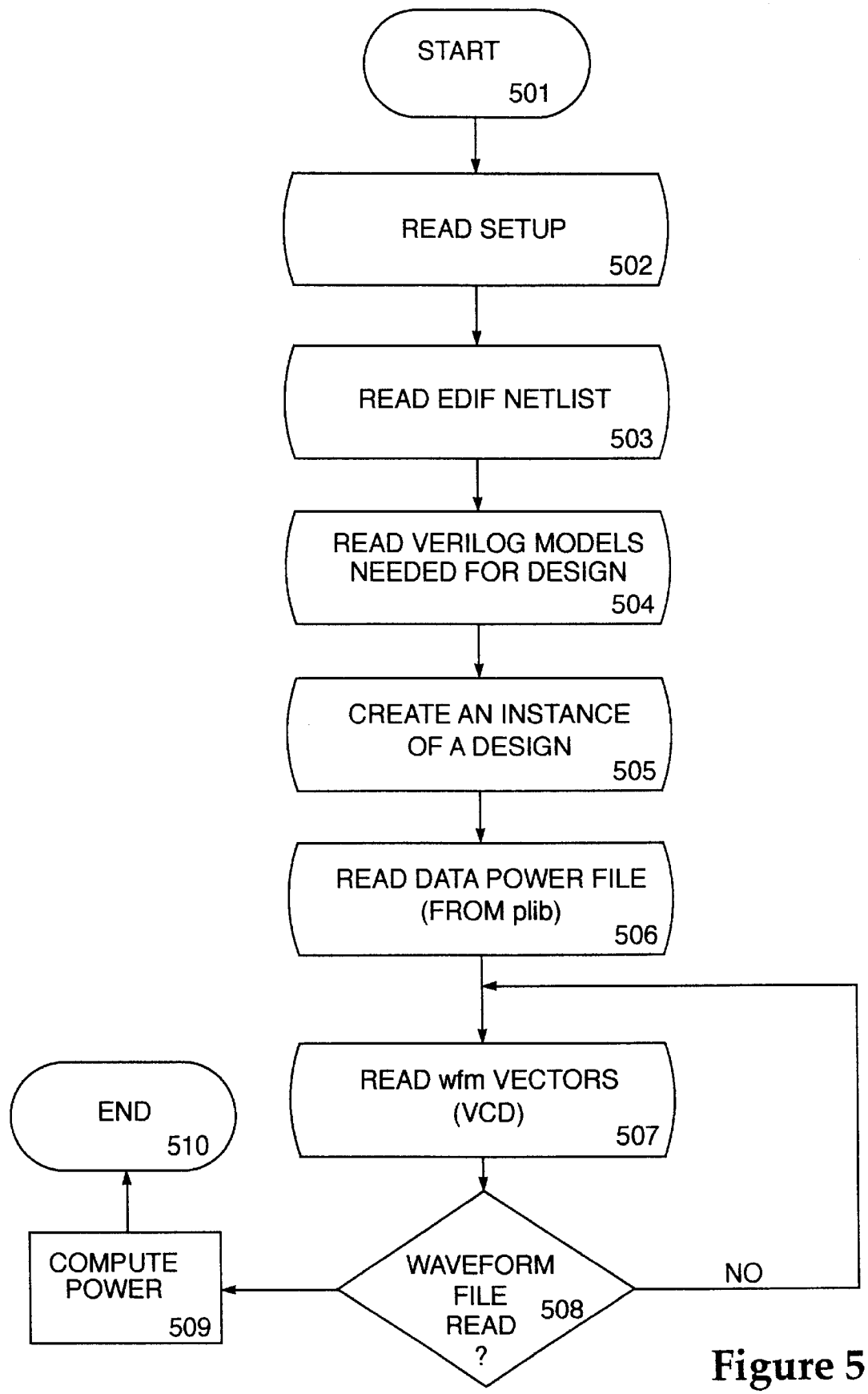
FIG. 5 is a flowchart illustrating the steps in calculating short circuit current for an IC design in the paact program.
Figure 6:
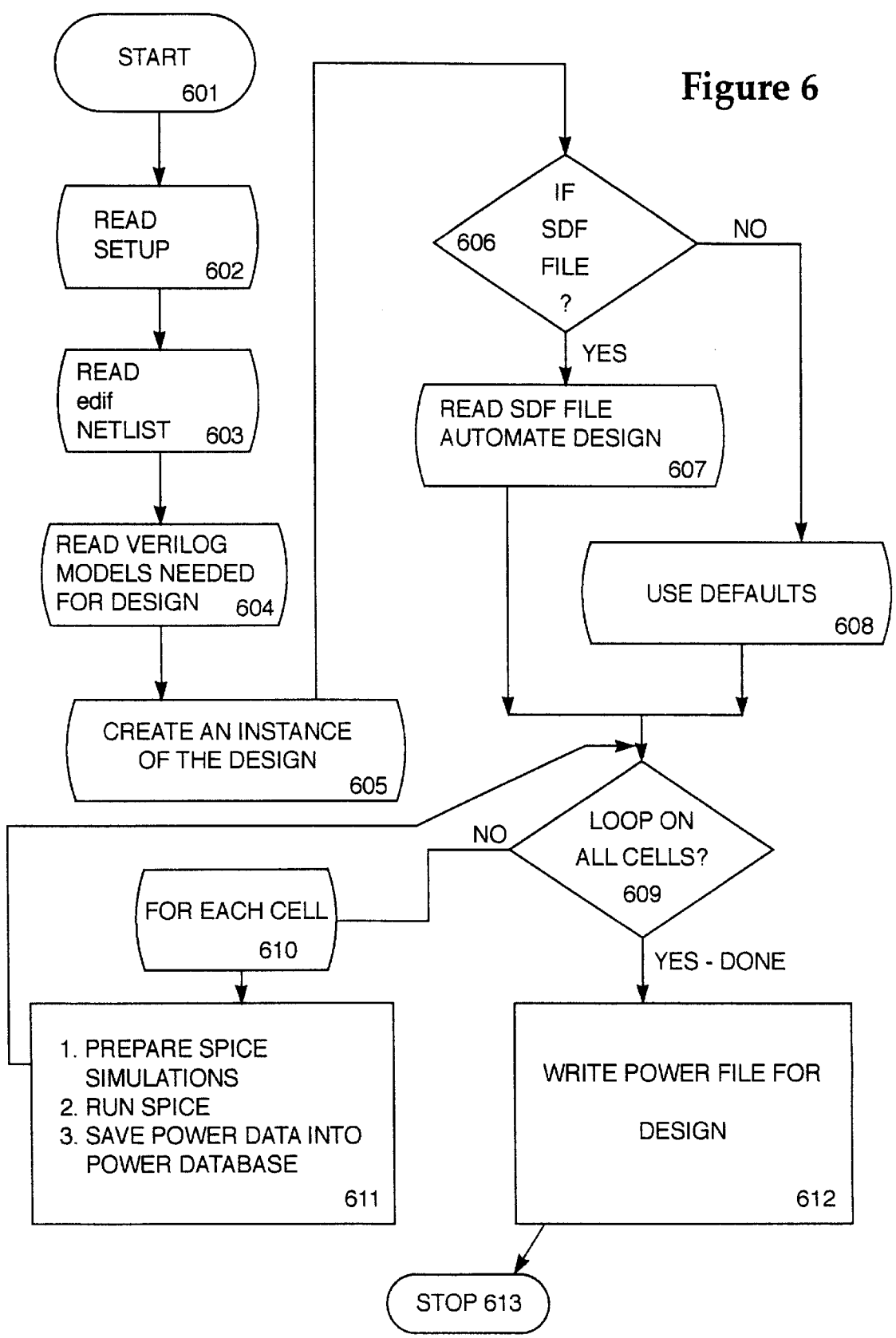
FIG. 6 is a flowchart illustrating the operation of the plib program for calculating power consumption for individual cells.

Specific techniques for performing the method of the present invention in the preferred embodiment will now be discussed in conjunction with FIGS. 5 and 6 and the Appendix of the present application. In the preferred embodiment of the present invention, the software of the Appendix was implemented on a Sun workstation using the C++ program. Several terms used in the present application in conjunction with VERILOG™ modeling may be defined as follows:

Edif: Electronic Design Interchange Format; one of the commonly used techniques of representing a chip design as an electronically readable data file.

SDF: Standard Delay Format; a file format typically used in the prior art to represent propagation delays in a cell.

VCD: Value Change Dump; a file format used to store values of signals in a design. The VCD file is typically created from logic simulators during a chip design simulation.

Truth Table: An m×n table where m rows represent input combinations of the (n−1) inputs and an output value (nth entry).

Input Slope: The time for an input pin of a cell to reach a threshold value. Value 1 is referred to as input slope, value 0 as output slope.

SPICE subcircuit: A description of a CMOS cell described in SPICE syntax.

FANOUT: The number of signals driven by the output of a gate.

FANIN: The number of input signals driving a gate.

pon(non): When a p-type (n-type) MOS transistor is conducting.

poff(noff): When a p-type (n-type) transistor is not conducting.

The apparatus and method of the present invention may be divided into three software programs incorporated in the Appendix as follows:

1. sub2sub: The input to this program is a SPICE subcircuit and an optional dictionary file. The program reads the SPICE subcircuit and writes out a new modified SPICE subcircuit. In the modified SPICE subcircuit written out, current meters 470 and 480 may be tied between $V_{DD}$ and the cell and between the cell and ground of $V_{SS}$. (See, e.g., FIG. 4). Current meters 470 and 480 may each comprise, for example, an ideal voltmeter and a known resistance and may measure current as a voltage drop across the known resistance. The modified SPICE subcircuit may measure short circuit current using the HSPICE™ MEASURE command.

2. plib: Referring to FIG. 6, in steps 601, 602, 603, and 604, the plib program reads a user circuit design using an edif netlist, propagation delays represented by a Standard Delay Format (SDF) file, and cell descriptions described by VERILOG™ models. An internal representation may then be created for the design in step 605.

In step 606 a determination is made whether an SDF file has been read. If so, processing proceeds to step 607 and SDF values are read from the file and the design automated. If not, default delay values are utilized as illustrated in step 608. Short circuit current calculations are then made for all cells within the design, as illustrated in steps 610–611. In step 611, SPICE simulations are prepared and power data calculated and stored into a power database. n passes are made through the data structures representing the edif netlist of the user design. Here, n represents the number of cells in the design. For each cell, the system collects all possible input slopes (rise/fall) for the input to output pins described in the specify block for which a pair of vectors have been collected. A SPICE deck containing the subcircuit is prepared and stimulus is setup as illustrated in FIG. 7.

The VERILOG™ description for the cells may then be analyzed and timing and functional parts separated out. A truth table for the cell may then be created by simulating the cell through all possible input combinations, as illustrated in FIG. 7.

After the truth table is created, all of the specify block information which represents input to output timing behavior is cycled through. For each input to output pin behavior, a pair of vectors are selected from the truth table. The vectors have the property of causing an output rise/fall on a rise/fall of an input pin.

Short circuit current may then be measured using the HSPICE™ MEASURE command. The process is repeated for all cells and all input/output pin combinations. After running the HSPICE™ calculations, the plib program outputs a file (short_circuit_pwr) which contains the following information for each cell:

input_pin
output_pin
cell_instance_name
rise_shortcircuit_current
fall_shortcircuit_current Where input_pin represents input pin data of a sub-circuit, output_pin represent output pin data of a sub-circuit and cell_instance_name is the name of the sub-circuit. The data in rise_shortcircuit_current represents the maximum shortcircuit current for a sub-circuit during rise time (i.e., low to high) of an input logic signal. The data in fall_shortcircuit current represents the maximum short circuit current for a sub-circuit during fall time (i.e., high to low) of an input logic signal. The format of this data is in a format similar to the SDF (standard delay format) for VERILOG™. In SDF, however, rise_shortcircuit_current and fall_shortcircuit_current would be replaced by rise and fall propagation delays.

Once all short circuit data for all cells has been calculated, as illustrated in step 609, the power data for the IC design is written to the power database in step 612 and processing is completed as illustrated in step 613.

3. paact: Referring to FIG. 5, the paact program reads the edif netlist, propagation delays from an SDF file, and VERILOG™ models for cells as illustrated in steps 501, 502, 503, and 504 and a model of the design created in step 505. The file short_circuit.pwr produced by the plib program is then input in step 506. The paact program then reads in simulation vectors from a value change dump (VCD) format file. Data structures used by paact to represent the design of the integrated circuit may be identical to the data structured used by plib.

The paact program, having read in short circuit data from file short_circuit_pwr, places the information in the same data structures used to represent timing (i.e, propagation delays). By using the same data structures, the software may use VCD data more accurately and efficiently. VCD data represents changes to signals(s) over the simulation time. If timing data is used during simulation, then this information causes the behavior of the signal waveforms to change to reflect the timing information. This feature may be used to accurately predict short circuit power, since for every input to output transition that describes timing for a cell there is a corresponding short circuit current value.

While reading the VCD file, the program paact performs the following steps:

1. For every signal change in the VCD file, set the signal value and time-stamp the time at which the signal changed.
2. For every signal change, mark the input and output pins of the cell which are fanouts of the signal.
3. For every signal change, pick the input and output pins of the cell(s) which drive the signal, fetch the input rise/fall, short circuit current stored, and the value to the gate instance of the cell.

After the entire VCD file has been read, as indicated in step 508, the paact program adds the short circuit value stored on each cell and divides that value by the total simulation time to predict the short circuit power consumed in the design for the given VCD file, as illustrated in step 509. Processing ends at step 510.

While the preferred embodiment and various alternative embodiments of the invention have been disclosed and described herein, it may be apparent to those skilled in the art which various changes in form and detail may be made without departing from the spirit and scope of the invention.

For example, the preferred embodiment has been described in connection with combinational logic circuits, which tend to use more power than other circuits in an integrated circuit design. However, the techniques of the present invention may also be applied to other types of circuits such as sequential logic circuits, without departing from the spirit and scope of the present invention.

What is claimed is:

1. A method for measuring power consumption in an integrated circuit design comprising a combination of a number of cells, said method comprising the steps of:
   creating a truth table model of a cell in the integrated circuit design;
   modeling the cell as a predetermined sub-circuit design having the same truth table as the truth table model of the cell; and
   measuring power consumption for the sub-circuit using a circuit model of the sub-circuit, said step of measuring power consumption for the sub-circuit comprising the steps of:
      modeling the sub-circuit as a circuit design using a SPICE program;
      determining rise and fall times for input signals to the sub-circuit;
      measuring short circuit current for the sub-circuit for determined rise and fall times;
      combining short circuit data with rise and fall time data to compute maximum Power consumption for a sub-circuit and storing maximum power consumption data in a standardized propagation delay data field into a logic modeling program; and
      calculating overall power consumption from maximum power consumption data stored in standard propagation delay data fields using standardized propagation delay timing calculation software within the logic modeling program to output a power consumption value in a propagation data field of the logic modeling program.

2. The method of claim 1, wherein said step of measuring power consumption of the sub-circuit comprises the steps of:
   determining a number of inputs and outputs to the sub-circuit;
   measuring power consumption for the sub-circuit for each combination of signals applied to the inputs of the sub-circuit; and
   using the measured power consumption for the sub-circuit for each combination of signals applied to the inputs of the sub-circuit to determine overall power consumption for the sub-circuit.

3. The method of claim 2, wherein said steps of creating a truth table for a cell, modeling the cell, and measuring power consumption of the sub-circuit are performed for each cell in the integrated circuit design, said method further comprising the step of:
   combining power consumption data for the number of cells to produce overall power consumption data.

4. The method of claim 1, wherein said step of modeling the sub-circuit using a SPICE program comprises the steps of:
   generating a circuit model for the sub-circuit having a logical function equivalent to the logical function of the sub-circuit; and
   inserting an ideal voltmeter and known resistance into the circuit model.

5. The method of claim 4, wherein said step of measuring short circuit current for the sub-circuit comprises the steps of:
   determining the maximum voltage drop across the known resistance during a short circuit condition.

6. A software program for instructing a computer system to measuring power consumption in an integrated circuit design comprising a combination of a number of cells, said program comprising:
   a first portion for creating a truth table model of a cell in the integrated circuit design;
   a second portion for modeling the cell as a predetermined sub-circuit design having the same truth table as the truth table model of the cell;
   a third portion for measuring power consumption for the sub-circuit using a circuit model of the sub-circuit, said third portion comprising:
      a fourth portion for modeling the sub-circuit as a circuit design using a SPICE program;
      a fifth portion for determining rise and fall times for input signals to the sub-circuit;
      a sixth portion for measuring short circuit current for the sub-circuit for determined rise and fall times;
      a seventh Portion for combining short circuit data with rise and fall time data to compute maximum power consumption for a sub-circuit;
      an eighth portion for outputting maximum power consumption data measured for the sub-circuit into a standardized propagation delay data field of a logic modeling program; and
      a ninth portion calculating overall power consumption from maximum power consumption data stored in standard propagation delay data fields using standardized propagation delay timing calculation software within the logic modeling program to output a power consumption value in a propagation data field of the logic modeling program.

7. The software program of claim 6, further comprising:
   a tenth portion for determining a number of inputs and outputs to the sub-circuit;
   an eleventh portion for measuring power consumption for the sub-circuit for each combination of signals applied to the inputs of the sub-circuit; and
   a twelfth portion for using the measured power consumption for the sub-circuit for each combination of signals applied to the inputs of the sub-circuit to determine overall power consumption for the sub-circuit.

8. The software program of claim 7, further comprising:

a thirteenth portion, coupled to the first, second, and third portions, for measuring power consumption for each cell in the integrated circuit design using said first, second, and third portions; and a fourteenth portion for combining power consumption data for the number of cells to produce overall power consumption data.

9. The software program of claim 8, wherein said fourth portion for modeling the sub-circuit using a SPICE program comprises:

a fifteenth portion for generating a circuit model for the sub-circuit having a logical function equivalent to the logical function of the sub-circuit; and a sixteenth portion for inserting an ideal voltmeter and known resistance into the circuit model.

10. The software program of claim 9, wherein said sixth portion for measuring short circuit current for the sub-circuit comprises:

a seventeenth portion for determining the maximum voltage drop across the known resistance during a short circuit condition.

11. A software program for use with a circuit emulation program for instructing a computer system to measuring power consumption in an integrated circuit design comprising a combination of a number of cells, said software program comprising:

a first portion for creating a truth table model of a cell in the integrated circuit design;

a second portion for modeling the cell as a predetermined sub-circuit design having the same truth table as the truth table model of the cell;

a third portion for interfacing with the circuit emulation program to measure power consumption for the sub-circuit in the circuit emulation program using a circuit model of the sub-circuit generated by the circuit emulation program;

a fourth portion for combining power consumption data for the sub-circuit using a logic emulation program to generate power consumption data for the cell;

wherein said third portion for interfacing with a circuit emulation program further comprises:

a fifth portion for combining short circuit data generated by the circuit emulation program with rise and fall time data to compute maximum power consumption for a sub-circuit; and a sixth portion for outputting maximum power consumption data measured for the sub-circuit into a standardized propagation delay data field utilized by the logic emulation program, wherein the logic emulation program calculates overall power consumption utilizing a routine for measuring overall propagation delay acting on maximum power consumption data stored in standardized propagation delay data fields and outputting an overall power consumption value in an overall propagation delay data field.

* * * * *